(12) United States Patent
Kamei

(10) Patent No.: US 11,966,157 B2
(45) Date of Patent: Apr. 23, 2024

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Kengo Kamei, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/741,827

(22) Filed: May 11, 2022

(65) Prior Publication Data
US 2022/0373880 A1 Nov. 24, 2022

(30) Foreign Application Priority Data

May 20, 2021 (JP) ................................ 2021-085582
Feb. 2, 2022 (JP) ................................ 2022-014992

(51) Int. Cl.
*G03F 7/00* (2006.01)
*G03F 9/00* (2006.01)

(52) U.S. Cl.
CPC .......... *G03F 7/0002* (2013.01); *G03F 9/7042* (2013.01)

(58) Field of Classification Search
CPC ..... G03F 7/0002; G03F 9/7042; G03F 9/7046
See application file for complete search history.

(56) References Cited

U.S. PATENT DOCUMENTS

| 10,416,553 B2 | 9/2019 | Usui | |
|---|---|---|---|
| 2007/0231421 A1* | 10/2007 | Nimmakayala | ....... G03F 9/7088 264/405 |
| 2015/0013559 A1* | 1/2015 | Hayashi | ................ G03F 9/7088 101/450.1 |
| 2015/0251348 A1* | 9/2015 | Usui | ...................... G03F 7/0002 264/293 |
| 2016/0207248 A1* | 7/2016 | Sato | ........................ G03F 7/0002 |
| 2016/0299444 A1* | 10/2016 | Komaki | ................. G03F 9/7042 |
| 2017/0357078 A1* | 12/2017 | Komiyama | ............... G02B 7/28 |

FOREIGN PATENT DOCUMENTS

JP 2016076626 A 5/2016

\* cited by examiner

*Primary Examiner* — Larry W Thrower
*Assistant Examiner* — Vipul Malik
(74) *Attorney, Agent, or Firm* — ROSSI, KIMMS & McDOWELL LLP

(57) ABSTRACT

Imprint apparatus performs, on shot regions of substrate, imprint process for transferring pattern of mold to imprint material arranged on the substrate. The apparatus includes detector for detecting first mark of the substrate and second mark of the mold, and controller configured to control positioning of the detector based on driving amount, held in a storage, by which the detector is to be driven to fit the first mark and the second mark within specific region of field of view of the detector, and correction value held in the storage and used to correct the driving amount. The controller performs alignment between shot region selected from the shot regions and the mold based on output of the detector, and updates the correction value held in the storage based on the output of the detector.

16 Claims, 7 Drawing Sheets

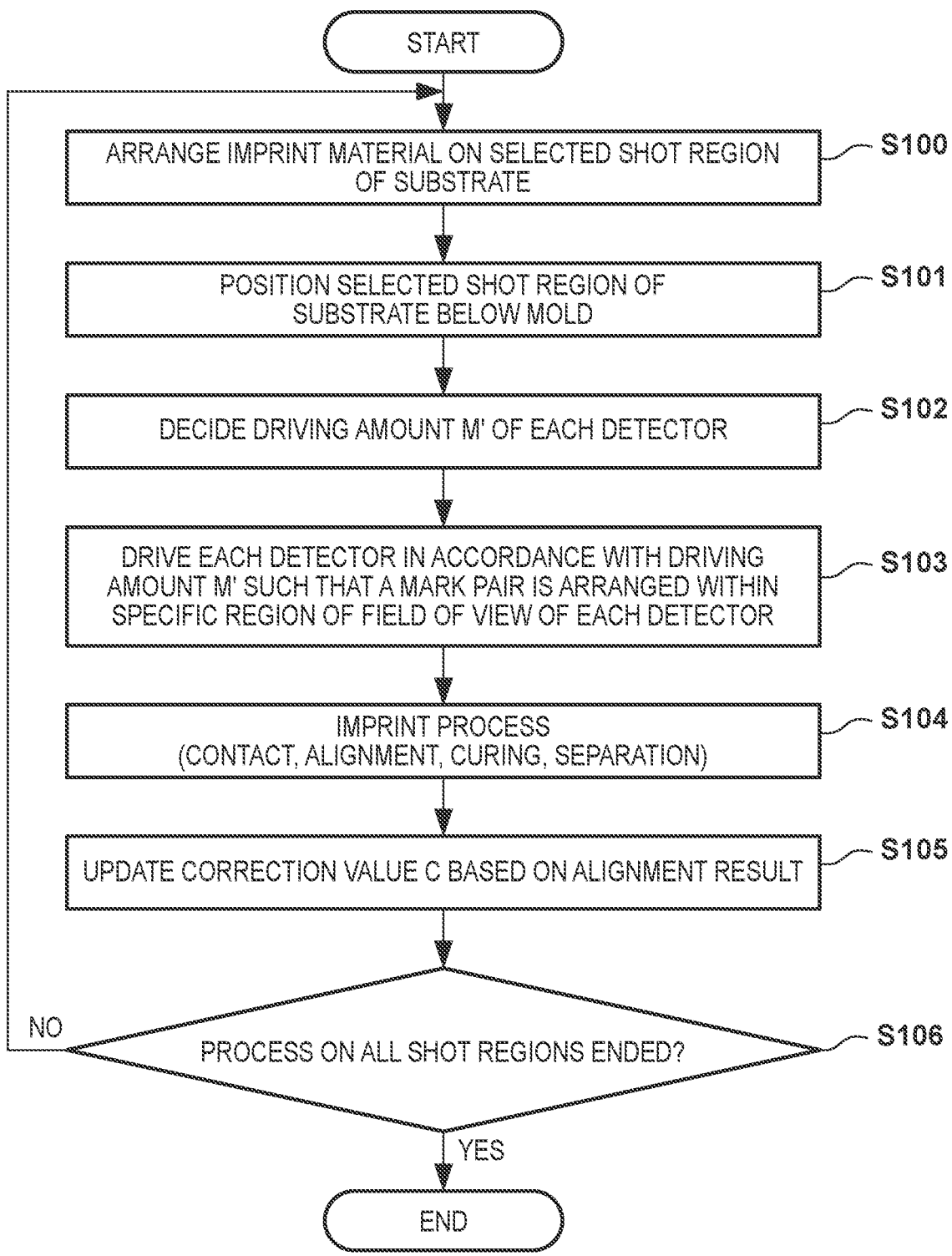

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

An imprint apparatus can be used in a lithography step for manufacturing an article such as a magnetic storage medium or a semiconductor device. In the imprint apparatus, a mold is brought into contact with an imprint material arranged on a shot region of a substrate and the imprint material is cured to transfer the pattern of the mold onto the shot region of the substrate. For example, in the manufacturing of a semiconductor device, the overlay accuracy (alignment accuracy) of the circuit pattern, which is to be newly formed, with respect to the circuit pattern, which has been already formed on the substrate, is important. In the imprint apparatus, as an alignment method between the shot region of the substrate and the mold, a die-by-die alignment method is employed. The die-by-die alignment method is a method in which, for each shot region of the substrate, the relative position between a substrate-side mark and a mold-side mark is optically detected and the shot region and the mold are aligned.

Japanese Patent Laid-Open No. 2016-76626 discloses that, based on the positional shift amount between the first shot region and the mold upon performing an imprint process on the first shot region, the relative position between the second shot region and the mold is corrected before bringing the imprint material on the second shot region into contact with the mold.

In die-by-die alignment, a detector detects the relative position between a mark provided in a shot region of a substrate and a mark provided in a mold to align the shot region and the mold. Here, since the aberration of an optical system of the detector and the influence of the illuminance unevenness of the mark can change in accordance with the position in the field of view of the detector, the detection error of the detector can change in accordance with the position of the mark in the field of view of the detector.

SUMMARY OF THE INVENTION

The present invention provides a technique advantageous in improving the alignment accuracy between a shot region of a substrate and a mold.

One of aspects of the present invention provides an imprint apparatus that performs, on a plurality of shot regions of a substrate, an imprint process for transferring a pattern of a mold to an imprint material arranged on the substrate, the apparatus comprising: a detector configured to detect a first mark provided in the substrate and a second mark provided in the mold; and a controller configured to control positioning of the detector based on a driving amount, held in a storage, by which the detector is to be driven to fit the first mark and the second mark within a specific region of a field of view of the detector, and a correction value held in the storage and used to correct the driving amount, wherein the controller performs alignment between a shot region selected from the plurality of shot regions and the mold based on an output of the detector, and updates the correction value held in the storage based on the output of the detector.

Further features of the present invention will become apparent from the following description of exemplary embodiments with reference to the attached drawings.

BRIEF DESCRIPTION OF THE DRAWINGS

FIG. 6 is a flowchart illustrating an operation of the imprint apparatus;

DESCRIPTION OF THE EMBODIMENTS

Figure 1:
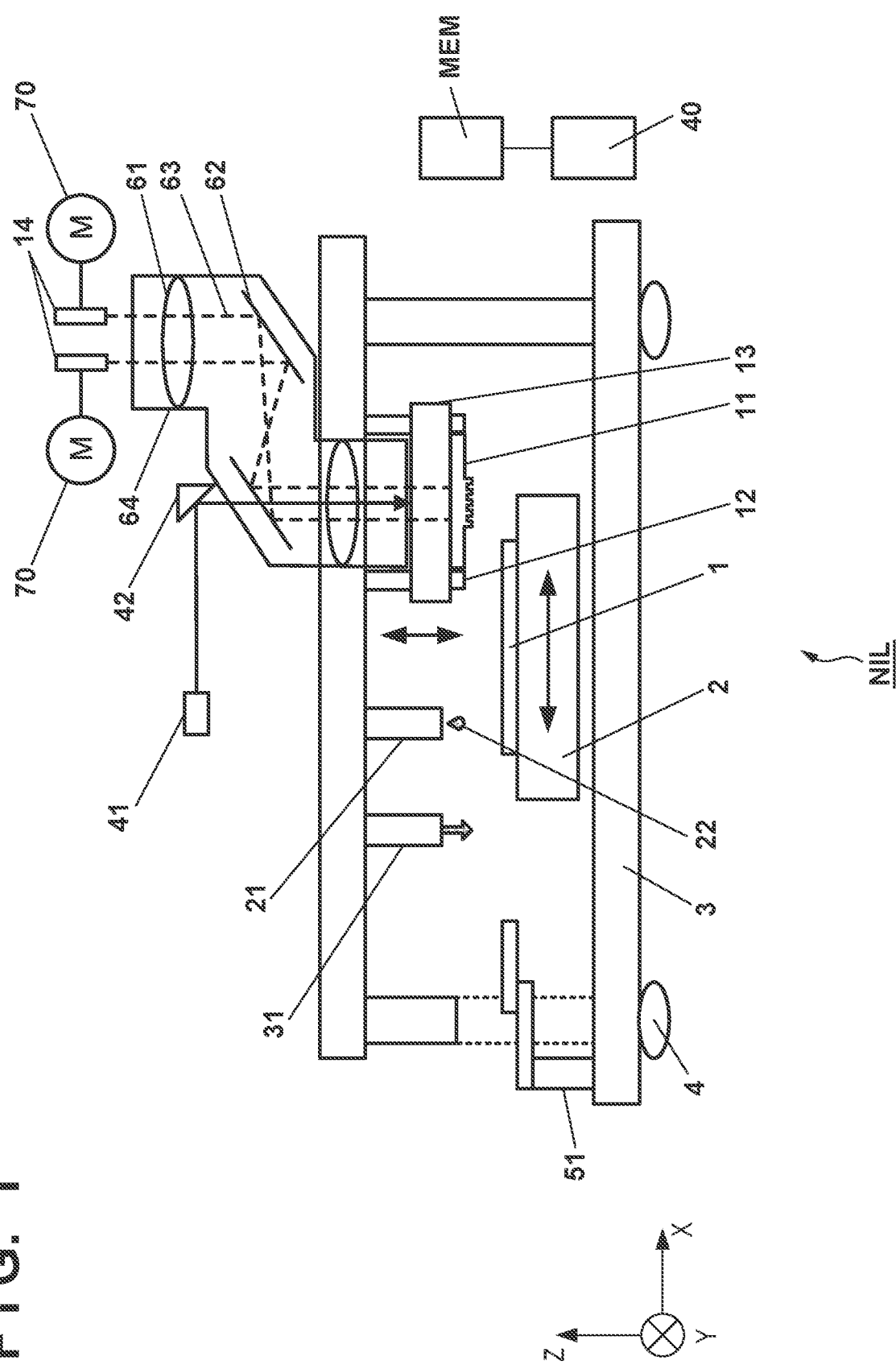
FIG. 1 is a view schematically and exemplarily showing the arrangement of an imprint apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and a posture is information that can be specified by values on the θX-, θY-, and θZ-axes. Positioning means controlling the position and/or posture. Alignment (positioning) can include controlling the position and/or orientation of at least one of a substrate and a mold such that the alignment error (overlay error) between the shot region of the substrate and the mold (pattern region thereof) decreases. In addition, alignment can include control to correct or change the shape of at least one of the shot region of the substrate and the pattern region of the mold.

FIG. 1 schematically and exemplarily shows the arrangement of an imprint apparatus NIL according to an embodiment. The imprint apparatus NIL can be configured to perform, on a plurality of shot regions of a substrate 1, an imprint process for transferring the pattern of a mold 11 to the imprint material arranged on the substrate 1. As the imprint material, a curable composition (to be also referred to a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor (Si, GaN, SiC, or the like), a resin, or the like can be used. A member made of a material different from the substrate may be provided on the surface of the substrate, as needed. The substrate is, for example, a silicon wafer, a compound semiconductor wafer, or silica glass.

The mold 11 includes a pattern region in a surface facing the substrate 1. The pattern region includes a pattern such as a circuit pattern. The pattern may be understood as being formed by a concave portion recessed with respect to the reference surface, or may be understood as being formed by a convex portion protruding from the reference surface. The material of the mold 11 is a material such as quartz which can transmit light such as ultraviolet light serving as the curing energy.

The imprint apparatus NIL can include a substrate operating mechanism 2, a mold operating mechanism 13, a curing unit 41, one or a plurality of detectors (scopes) 14, a dispenser 21, and a controller 40. The substrate operating mechanism 2 can include a substrate holder that holds the substrate 1, and a substrate driving mechanism that positions the substrate 1 by driving the substrate holder. The substrate operating mechanism 2 can be configured to drive the substrate 1 in a plurality of axes (for example, three axes of the X-axis, the Y-axis, and the θZ-axis, and preferably six axes of the X-axis, the Y-axis, the Z-axis, the θX-axis, the θY-axis, and the θZ-axis). The substrate holder can hold the substrate 1 by a holding method such as vacuum suction or electrostatic attraction. The substrate driving mechanism can drive the substrate holder along a base 3. The base 3 can be supported by a mount 4, and this can reduce the vibration transmitted from the floor to the base 3.

The mold operating mechanism 13 can include a mold holder that holds the mold 11, and a mold driving mechanism that positions the mold 11 by driving the mold holder. The mold operating mechanism 13 can be configured to drive the mold 11 in a plurality of axes (for example, three axes of the Z-axis, the θX-axis, and the θY-axis, and preferably six axes of the X-axis, the Y-axis, the Z-axis, the θX-axis, the θY-axis, and the θZ-axis). The substrate operating mechanism 2 and the mold operating mechanism 13 form a relative driving mechanism that drives at least one of the substrate 1 and the mold 11 so as to adjust the relative position between the substrate 1 and the mold 11. Adjustment of the relative position by the relative driving mechanism includes driving for bringing the mold 11 into contact with the imprint material on the substrate 1 and separating the mold 11 from the cured imprint material (a pattern of a cured product). Adjustment of the relative position by the relative driving mechanism also includes alignment between the substrate 1 (shot region thereof) and the mold 11 (pattern region thereof). The mold operating mechanism 13 may include a deforming mechanism 12 that deforms the mold 11 or the pattern region of the mold 11. Deformation of the mold 11 or the pattern region of the mold 11 by the deforming mechanism 12 can contribute to improving the alignment accuracy between the shot region of the substrate 1 and the pattern region of the mold 11.

The curing unit 41 cures the imprint material by irradiating the imprint material arranged or filled in a space between the shot region of the substrate 1 and the pattern region of the mold 11 with curing energy (for example, optical energy). The curing unit 41 may include a mirror 42 that deflects or bends the curing energy. The curing unit 41 may also include another one or a plurality of optical elements.

Each detector 14 can be used to detect the mark (to be also referred to as the first mark for descriptive convenience) provided in the substrate 1 (shot region thereof) and the mark (to be also referred to as the second mark for descriptive convenience) provided in the mold 11. For example, the detector 14 can be used to detect the relative position between the first mark provided in the shot region of the substrate 1 and the second mark provided in the mold 11. Alternatively, the detector 14 can be used to detect the position (for example, the position in the field of view of the detector 14) of at least one of the first mark provided in the shot region of the substrate 1 and the second mark provided in the mold 11.

The detector 14 can be also referred to as, for example, an alignment scope. The detector 14 can include an image capturing device (for example, an image sensor such as a CCD sensor or a MOS sensor), an optical system that forms the images of the first mark and the second mark on the image capturing surface of the image capturing device, and an illumination device that irradiates the first mark and the second mark with measurement light 63. The image formed on the image capturing surface may be the image individually formed by each of the first mark and the second mark, or a moire image or an interference fringe formed by the first mark and the second mark while the mold and the substrate are in contact with each other via the imprint material. At least one of the first mark and the second mark may be a part of the circuit pattern.

The imprint apparatus NIL can include a plurality of driving mechanisms 70 that individually drive and position the plurality of detectors 14. Each driving mechanism 70 can drive the detector 14 such that the first mark and the second mark forming a mark pair fit within a specific region of the field of view of the detector 14. Such an operation can be controlled by the controller 40. The specific region of the field of view of the detector 14 can be, for example, a central region of the field of view. The central region can be a region with the center of the field of view as the symmetric center and having the area of 50% or less, 40% or less, 30% or less, 20% or less, or 10% or less of the area of the field of view.

The imprint apparatus NIL may include an optical system such as a relay optical system 64 between the mold 11 or the mold operating mechanism 13 and one or the plurality of detectors 14. At least a part of the optical system may be shared with, for example, the curing unit 41. The relay optical system 64 can include, for example, one or a plurality of lenses 61 and one or a plurality of mirrors 62. The relay optical system 64 may be an equal-magnification system, or may be an enlargement system. For example, the relay optical system 64 can include two lenses 61 and two mirror 62, but the present invention is not limited to this. The relay optical system 64 is preferably a telecentric optical system. In this specification, the detector 14 means a portion which is driven and positioned by the driving mechanism 70, and the relay optical system 64 is described as a component different from the detector 14. The configuration including the detector 14 and the relay optical system 64 can be understood as a detection system.

The dispenser 21 is configured to supply or arrange an imprint material 22 onto the shot region of the substrate 1. The dispenser 21 is an optional component. If the imprint material is arranged on the substrate 1 by a dispenser outside the imprint apparatus NIL, the dispenser 21 may not be provided. The kind of the imprint material 22 is appropriately selected in accordance with the kind of an article such as a semiconductor device to be manufactured. In accordance with the kind of the imprint material 22, the curing energy (for example, the wavelength) to be applied to the imprint material 22 by the curing unit 41 can also be changed.

The imprint apparatus NIL can further include an alignment measurement device 31 used to position the substrate 1, and a conveyance system for loading the mold 11 and the substrate 1 into the chamber (not shown) of the imprint apparatus NIL and unloading them from the chamber. The alignment measurement device 31 can detect, for example, a positional shift of the substrate 1 in the X and Y directions. The conveyance system described above can include a mold conveyance mechanism (not shown) for loading/unloading the mold 11, and a substrate conveyance mechanism for loading/unloading the substrate 1. The mold conveyance mechanism includes a conveyance robot, and can convey the mold 11 between a mold stocker arranged at a predetermined position and the mold operating mechanism 13. The mold stocker can be a carrier for storing a plurality of the molds 11. A substrate conveyance mechanism 51 can convey, by a conveyance robot, the substrate 1 between a substrate carrier (not shown), which can be arranged in a predetermine substrate loading port, and the substrate holder of the substrate operating mechanism 2.

The controller 40 can control the above-described components of the imprint apparatus NIL, and define the operation of the imprint apparatus NIL based on information stored in a storage MEM such as a memory. The storage MEM may be provided in the controller 40, or may be provided outside the controller 40. The controller 40 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components.

The operation of the imprint apparatus NIL will be exemplarily described below. This operation is controlled by the controller 40. The controller 40 can control the substrate conveyance mechanism 51 such that the substrate 1 forming a lot is conveyed from the substrate carrier to the substrate holder of the substrate operating mechanism 2. Further, the controller 40 can control the mold conveyance mechanism such that the mold 11 designated by control information (process recipe) used to control the process of the lot is conveyed from the mold stocker to the mold holder of the mold operating mechanism 13.

Figure 2A:
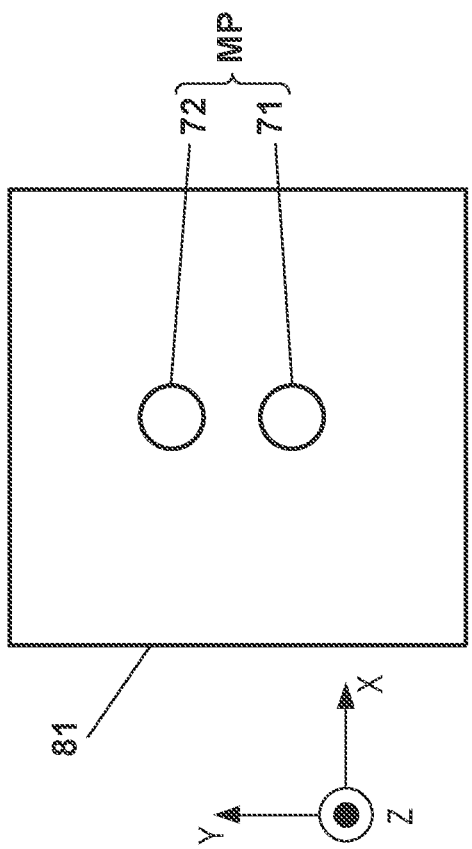
FIGS. 2A to 2D are views for explaining detection of marks by a detector (scope)

Then, the controller 40 can perform prealignment measurement to measure the relative position between the mold 11 and each shot region of the substrate 1. More specifically, the controller 40 can use the alignment measurement device 31 and the detector 14 to measure the positions of the substrate 1 and the mold 11 with the coordinates of the imprint apparatus NIL as a reference. Here, the controller 40 can cause the driving mechanism 70 to drive the detector 14 such that the second mark selected from a plurality of the second marks provided in the mold 11 fits within the field of view of the detector 14. Then, as schematically shown in FIG. 2A, the position of a second mark 72 of the mold 11 can be measured or detected with the position of the detector 14 as a reference. On the other hand, while controlling the substrate operating mechanism 2 such that a plurality of the first marks provided in the substrate 1 sequentially fit within the field of view of the alignment measurement device 31, the controller 40 can use the alignment measurement device 31 to measure or detect the position of each first mark. With this, the position of each of the plurality of shot regions of the substrate 1 can be measured or detected with the position of the substrate operating mechanism 2 as a reference.

Next, the controller 40 can control the substrate operating mechanism 2 and the dispenser 21 so as to arrange the imprint material on the shot region, among the plurality of shot regions of the substrate 1, on which the imprint process is to be performed. Then, the controller 40 can control the substrate operating mechanism 2 such that the shot region is positioned below the mold 11. Then, the controller 40 can control the mold operating mechanism 13 to bring the imprint material on the shot region into contact with the pattern region of the mold 11. With this, the imprint material on the shot region can be filled in the space (including the pattern of the pattern region) between the shot region and the pattern region of the mold 11. Further, the controller 40 can cause the plurality of driving mechanisms 70 to drive the plurality of detectors 14 such that the second mark serving as the detection target is arranged in the specific region of the field of view of one or the plurality of detectors, and typically the plurality of detectors 14.

Next, the controller 40 can perform alignment between the shot region of the substrate 1 and the pattern region of the mold 11 based on the detection results of the plurality of detectors 14. Such alignment is called die-by-die alignment. At this time, the controller 40 may cause the deforming mechanism 12 to deform the mold 11 or the pattern region.

Next, the controller 40 can control the curing unit 41 to apply curing energy to the imprint material on the shot region of the substrate 1 via the mold 11. With this, the imprint material on the shot region of the substrate 1 is cured, and a pattern formed of a cured product of the imprint material can be formed. Then, the controller 40 can control the mold operating mechanism 13 to separate the mold 11 from the cured product of the imprint material on the shot region of the substrate 1. With this, the cured product pattern to which the pattern of the pattern region of the mold 11 has been transferred can remain on the shot region of the substrate 1. By repeating the above-described process on the remaining shot regions of the substrate 1, the controller 40 can form the pattern formed of the cured product of the imprint material in each of all the shot regions of the substrate 1.

Figure 3:
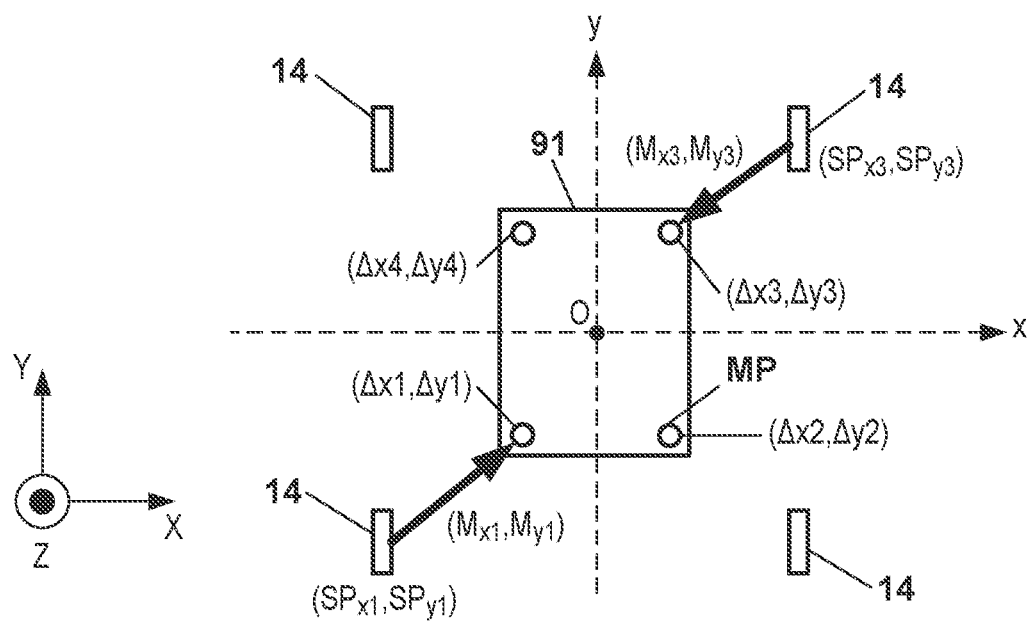
FIG. 3 is a view schematically showing driving of the detector (scope)

FIG. 3 shows four mark pairs MP. Each mark pair MP is formed by the first mark provided in the shot region of the substrate 1 and the second mark provided in the mold 11. With reference to FIG. 3, driving of the detector 14 by the driving mechanism 70 in an operation of fitting the mark pair MP, that is, the first mark provided in the substrate 1 and the second mark provided in the mold 11, within the specific region of the field of view of the detector 14. In FIG. 3, the shot region of the substrate 1 and the pattern region of the mold 11 are shown as a region 91. Further, in FIG. 3, the mark pair formed by the first mark provided in the substrate 1 and the second mark provided in the mold 11 is shown as the mark pair MP. The mark pair MP can be understood as representing the first mark, or can be understood as representing the second mark.

The mold 11 can be held by the mold holder of the mold operating mechanism 13 such that the center of the pattern region of the mold 11 almost matches an origin O (0, 0) of the imprint apparatus NIL. Further, the substrate 1 can be aligned by the substrate operating mechanism 2 such that the center of the shot region, among the plurality of shot regions, on which the imprint process is to be performed immediately after almost matches the origin (0,0) of the imprint apparatus NIL. Thus, the center of the shot region of the substrate 1 and the center of the pattern region of the mold 11 almost match the origin (0,0) of the imprint apparatus NIL.

The relative positions of a plurality of the mark pairs MP, which include the first to fourth mark pairs MP here, with respect to the center of the shot region of the substrate 1 or the center of the pattern region of the mold 11 are indicated by ($\Delta x1$, $\Delta y1$), ($\Delta x2$, $\Delta y2$), ($\Delta x3$, $\Delta y3$), ($\Delta x4$, $\Delta y4$), respectively. The driving amounts by which the four detectors 14 are moved from respective home positions to fit each of the mark pairs MP within the specific region of the field of view of the corresponding detector 14 among the four detectors 14 are expressed by (Mx1, My1), (Mx2, My2), (Mx3, My3), and (Mx4, My4), respectively. For example, the driving amounts (Mx1, My1), (Mx2, My2), (Mx3, My3), and (Mx4, My4) are expressed as following equation (1):

$$(Mx1, My1) = (\Delta x1, \Delta y1) - (SPx1, SPy1)$$

$$(Mx2, My2) = (\Delta x2, \Delta y2) - (SPx2, SPy2)$$

$$(Mx3, My3) = (\Delta x3, \Delta y3) - (SPx3, SPy3)$$

$$(Mx4, My4) = (\Delta x4, \Delta y4) - (SPx4, SPy4) \qquad (1)$$

Here, (SPx1, SPy1), (SPx2, SPy2), (SPx3, SPy3), and (SPx4, SPy4) are the coordinates of the home positions of the first to fourth detectors 14, respectively. The controller 40 can obtain ($\Delta x1$, $\Delta y1$), ($\Delta x2$, $\Delta y2$), ($\Delta x3$, $\Delta y3$), and ($\Delta x4$, $\Delta y4$) from, for example, control information (process recipe) used to control the process of the lot. Here, if the error factor is neglectable, the mark pairs MP can be fit within the specific regions of the field of views of the first to fourth detectors 14, respectively, by driving the first to fourth detectors 14 in accordance with the driving amounts (Mx1, My1), (Mx2, My2), (Mx3, My3), (Mx4, My4), respectively. However, in practice, the aberration of the relay optical system 64 and a change of the characteristic thereof due to heat or the like, the driving error by the driving mechanism 70, the illuminance unevenness of the measurement light 63 of the detector 14, and the like can be error factors. Therefore, it is difficult to fit the mark pairs MP within the specific regions of the fields of view of the first to fourth detectors 14, respectively, only by driving the first to fourth detectors 14 in accordance with the driving amounts (Mx1, My1), (Mx2, My2), (Mx3, My3), (Mx4, My4), respectively.

As schematically shown in FIGS. 2A to 2D, the relative position of the mark pair MP (a first mark 71 and the second mark 72) in a field of view 81 of the detector 14 can change in accordance with the relative position between the detector 14 and the mark pair MP. When the relative position of the mark pair MP in the field of view 81 changes, the appearance of the mark pair MP (the shape of the mark or the mark pair in the detection image) can change due to the aberration of the relay optical system 64, the illuminance unevenness of the measurement light 63, and the like. The detection result of the relative position between the first mark 71 and the second mark 72 obtained by performing image processing on the detection image of the mark pair MP by the detector 14 can also change in accordance with the relative position of the mark pair MP in the field of view 81.

Figure 2B:
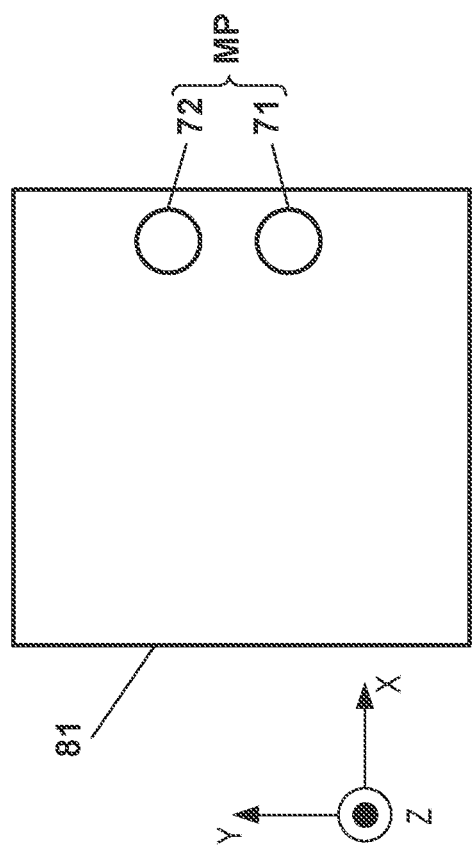
Figure 2C:
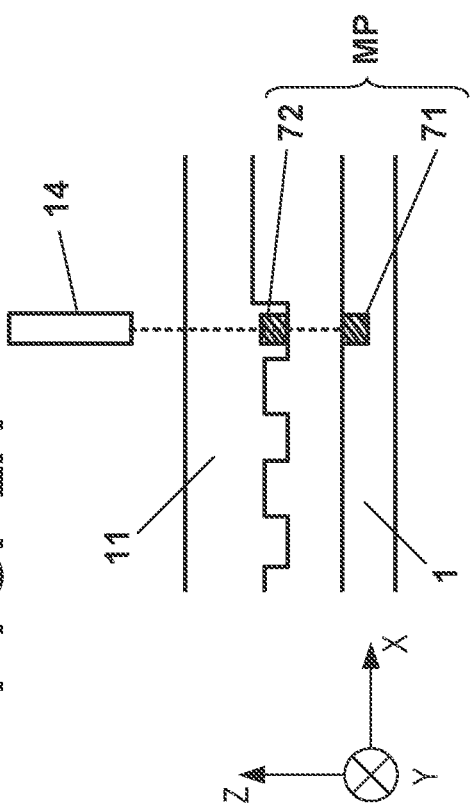
Figure 2D:
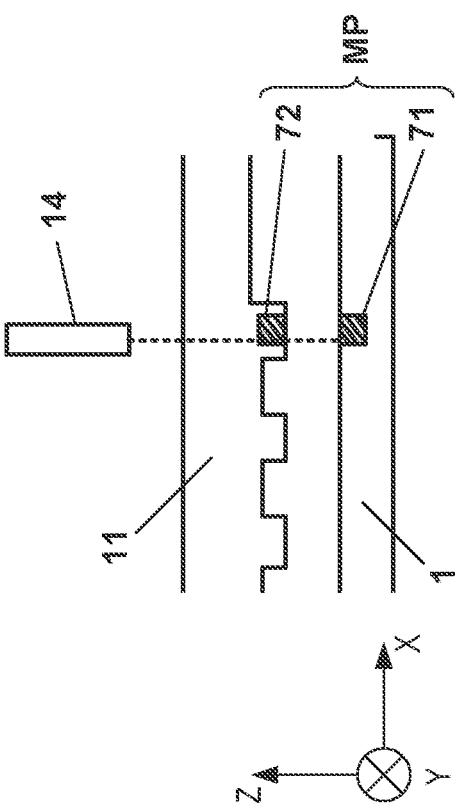

At the relative position between the mark pair MP and the detector 14 as shown in FIG. 2A, the mark pair MP fits within the central region of the field of view 81 of the detector 14 as shown in FIG. 2B. On the other hand, at the relative position between the mark pair MP and the detector 14 as shown in FIG. 2C, the mark pair MP does not fit within the central region of the field of view 81 of the detector 14 as shown in FIG. 2D. The detection accuracy of the relative position between the first mark 71 and the second mark 72 changes between FIG. 2B and FIG. 2D. More specifically, the detection accuracy is higher in FIG. 2B.

In alignment by die-by-die alignment, a measurement error of the relative position between the first mark 71 provided in the shot region of the substrate 1 and the second mark 72 provided in the mold 11 affects the alignment accuracy. Therefore, it is preferable to detect the relative position between the first mark 71 and the second mark 72 in a state in which the mark pair MP always fits within the specific region (preferably, the central region) in the field of view 81 of the detector 14. With this, the measurement error can be kept to a constant value.

However, heat can be generated in the optical elements, for example, the lens 61 and the mirror 62, of the relay optical system 64 due to the measurement light 63 used by the detector 14. This can change the optical characteristic of the relay optical system 64. This change of the optical characteristic can cause a change of the relative position of the mark pair MP in the field of view 81 of the detector 14. Further, a driving error of the detector 14 by the driving mechanism 70 can also cause a change of the relative position of the mark pair MP in the field of view 81 of the detector 14.

Figure 4:
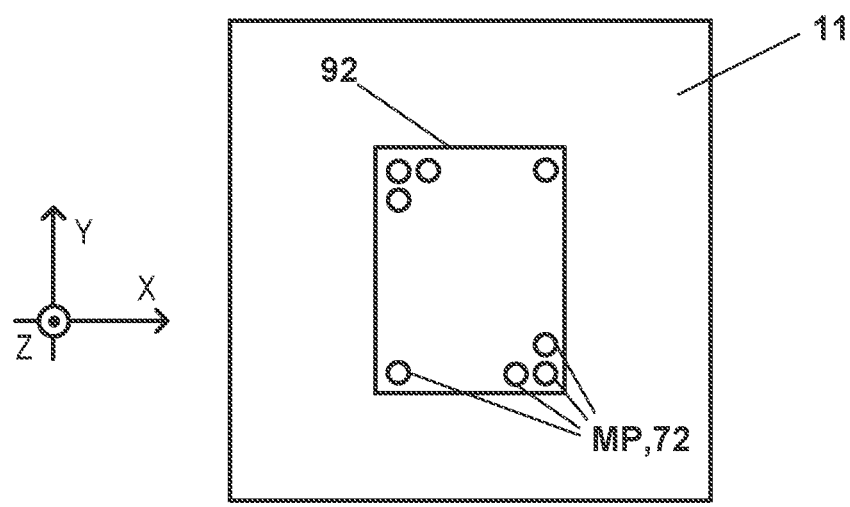
FIG. 4 is a view illustrating the arrangement of a plurality of marks.

In addition, as illustrated in FIG. 4, a problem can occur when multiple second marks 72 (in other words, mark pairs MP) in a pattern region 92 of the mold 11 are selectively used to detect an alignment error between the shot region and the pattern region 92. More specifically, the multiple second marks 72 (mark pairs MP) can hold heat amounts different from each other. Therefore, in accordance with the mark pair MP in shot region or the pattern region 92, the shift amount of the relative position of the mark pair MP in the field of view 81 of the detector 14 can change.

Therefore, in this embodiment, the controller 40 decides the driving amounts (M'x1, M'y1), (M'x2, M'y2), (M'x3, M'y3), and (M'x4, M'y4) by which the four detectors 14 are moved from respective home positions to target coordinate positions (target positions), respectively, according to equation (2) instead of equation (1).

$$(M'x1, M'y1) = (Mx1, My1) + (Cx1, Cy1)$$

$$(M'x2, M'y2) = (Mx2, My2) + (Cx2, Cy2)$$

$$(M'x3, M'y3) = (Mx3, My3) + (Cx3, Cy3)$$

$$(M'x4, M'y4) = (Mx4, My4) + (Cx4, Cy4) \quad (2)$$

Here, (Mx1, My1) expresses the driving amount by which the detector 14 is to be driven to fit the first mark pair (the first mark and the second mark), which is selected from the plurality of mark pairs used to measure the alignment error, within the specific region of the field of view of the detector 14 that measures the alignment error. Similarly, (Mx2, My2) expresses the driving amount by which the detector 14 is to be driven to fit the second mark pair (the first mark and the second mark), which is selected from the plurality of mark pairs used to measure the alignment error, within the specific region of the field of view of the detector 14 that measures the alignment error. Similarly, (Mx3, My3) expresses the driving amount by which the detector 14 is to be driven to fit the third mark pair (the first mark and the second mark), which is selected from the plurality of mark pairs used to measure the alignment error, within the specific region of the field of view of the detector 14 that measures the alignment error. Similarly, (Mx4, My4) expresses the driving amount by which the detector 14 is to be driven to fit the fourth mark pair (the first mark and the second mark), which is selected from the plurality of mark pairs used to measure the alignment error, within the specific region of the field of view of the detector 14 that measures the alignment error.

Each of (Cx1, Cy1), (Cx2, Cy2), (Cx3, Cy3), and (Cx4, Cy4) expresses the correction value corresponding to the relative position of the first mark 71 in the shot region (or the second mark 72 in the pattern region). Equation (2) may be transformed into following equation (3) using equation (1).

$$(M'x1, M'y1) = (\Delta x1, \Delta y1) - (SPx1, SPy1) + (Cx1, Cy1)$$

$$(M'x2, M'y2) = (\Delta x2, \Delta y2) - (SPx2, SPy2) + (Cx2, Cy2)$$

$$(M'x3, M'y3) = (\Delta x3, \Delta y3) - (SPx3, SPy3) + (Cx3, Cy3)$$

$$(M'x4, M'y4) = (\Delta x4, \Delta y4) - (SPx4, SPy4) + (Cx4, Cy4) \quad (3)$$

Figure 5:
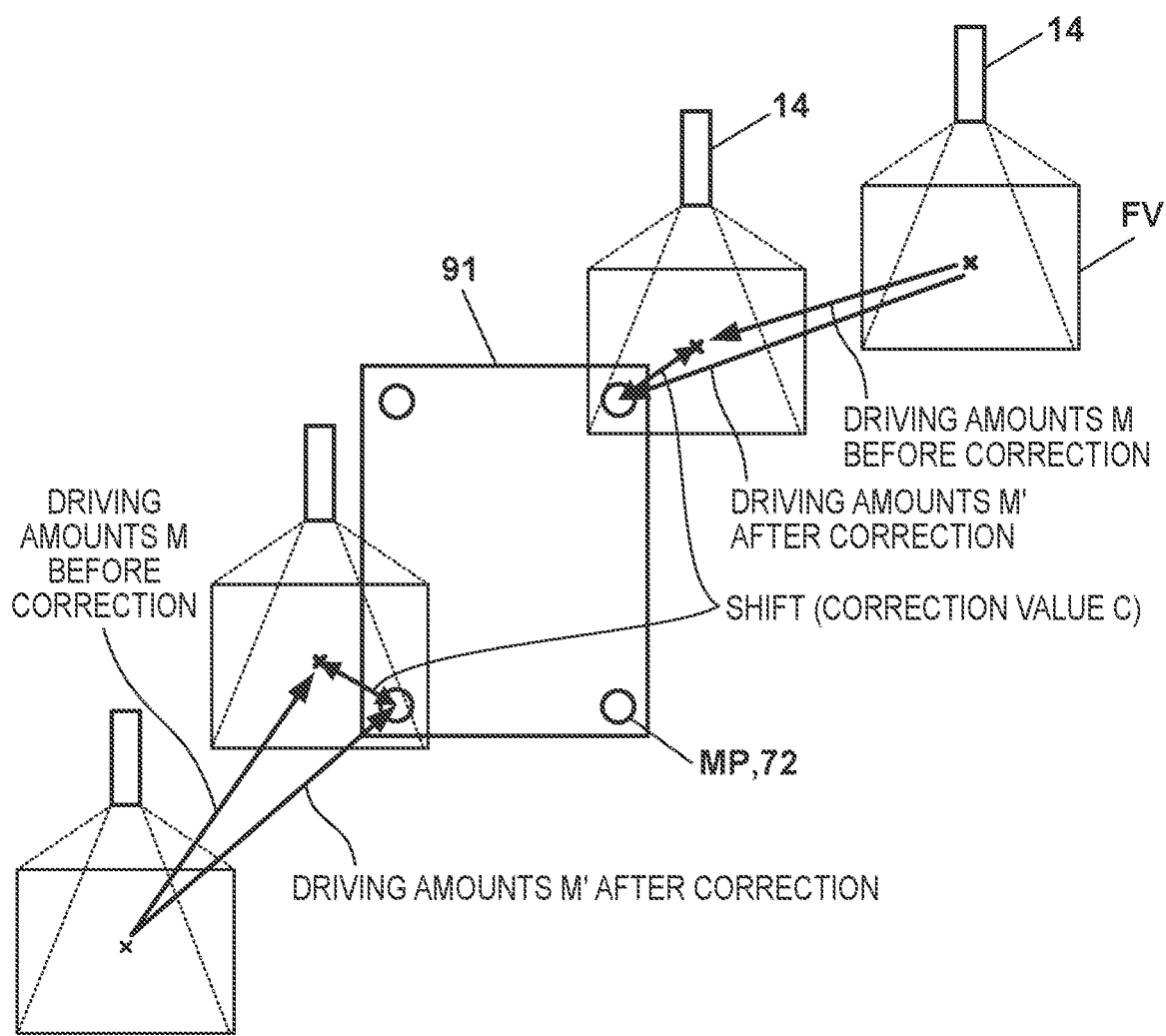
FIG. 5 is a view schematically showing driving of the detector (scope)

In FIG. 5, the driving amounts (Mx1, My1), (Mx2, My2), (Mx3, My3), and (Mx4, My4) are illustrated as driving amounts M before correction. Further, in FIG. 5, the driving amounts (M'x1, M'y1), (M'x2, M'y2), (M'x3, M'y3), and (M'x4, M'y4) are illustrated as driving amounts M' after correction. In addition, in FIG. 5, the correction values (Cx1, Cy1), (Cx2, Cy2), (Cx3, Cy3), and (Cx4, Cy4) are illustrated as correction values C. The notation described above also applies to the following description.

FIG. 6 illustrates the sequence of a process of forming a pattern in each of the plurality of shot regions of the substrate 1 in the imprint apparatus NIL. The process illustrated in FIG. 6 is controlled by the controller 40. In step S100, the controller 40 controls the substrate operating mechanism 2 and the dispenser 21 so as to arrange the imprint material on the shot region (to be referred to as the selected shot region hereinafter) selected from the plurality of shot regions. In step S101, the controller 40 controls the substrate operating mechanism 2 so as to position the selected shot region below the mold 11 to perform the imprint process on the selected shot region among the plurality of shot regions.

In step S102, based on the driving amounts M and the correction values C stored in the storage MEM, the controller 40 decides a plurality of the driving amounts M' for driving the plurality of detectors 14, respectively, according to equation (2) or equation (3). Note that M'=M+C. Here, the correction value C held in the storage MEM is updated by the controller 40 in step S105 to be described later. Accordingly, if the updated correction value C is held in the storage MEM, the controller 40 can decide the driving amount M' based on the driving amount M and the updated correction value C. Typically, the plurality of driving amounts M' are different from each other, and the plurality of correction values C are different from each other. In step S103, the controller 40 controls the plurality of driving mechanisms 70 so as to drive the plurality of detectors 14 in accordance with the plurality of driving amounts M' decided in step S102. Here, if the plurality of correction values C used to decide the plurality of driving amounts M' are appropriate, this driving fits the mark pair within the specific region of the field of view of the corresponding one of the plurality of detectors 14. Note that when the imprint process is continuously performed on the plurality of shot regions, the controller 40 may not return the detector 14 to the home position but move the detector 14 to the position decided by the driving amount M' for the next shot region. At this time, if the correction value C is the same as in the process on the preceding shot region, the position of the detector 14 is also the same as in the process on the preceding shot region. Hence, the detector 14 may not be moved.

In step S103, the controller 40 performs the imprint process. The imprint process can include a contact step, an alignment step, a filling step, a curing step, and a separation step. In the contact step, the controller 40 controls the mold operating mechanism 13 so as to bring the pattern region of the mold 11 into contact with the imprint material on the selected shot region. With this, filling of the imprint material into the space between the selected shot region and the pattern region is started. In parallel with filling of the imprint material, the alignment step is performed.

In the alignment step, the controller 40 performs alignment between the selected shot region and the mold based on outputs of the plurality of detectors 14. More specifically, in the alignment step, the controller 40 uses each of the plurality of detectors 14 to detect the relative position between the first mark and the second mark in each of the plurality of mark pairs and, based on the results of the plurality of detectors 14, detects the alignment error between the selected shot region and the mold 11 (pattern region thereof). Further, in the alignment step, the controller 40 performs alignment between the selected shot region and the pattern region of the mold 11 while controlling at least one of the substrate operating mechanism 2 and the mold operating mechanism 13 so as to make the alignment error fall within an allowable range. The detection of the alignment error and the alignment based on the alignment error can be repeated a plurality of times or continuously performed. In the curing step, the controller 40 controls the curing unit 41 so as to apply curing energy to the imprint material between the selected shot region and the pattern region of the mold 11. In the separation step, the controller 40 controls the mold operating mechanism 13 so as to separate the pattern region of the mold 11 from the cured imprint material on the selected shot region.

In step S105, based on the outputs of the detectors 14 in the imprint process on the selected shot region, the controller 40 can update the correction values (Cx1, Cy1), (Cx2, Cy2), (Cx3, Cy3), and (Cx4, Cy4) held in the storage MEM. Each correction value indicates, for example, the shift amount between the center position of the field of view of the detector 14 and the representative position of the mark pair at the time of the alignment. For example, the controller 40 can update each of the correction values (Cx1, Cy1), (Cx2, Cy2), (Cx3, Cy3), and (Cx4, Cy4) based on the amount and direction of the change of the representative position of the mark pair obtained by performing the alignment step. The representative position of the mark pair is, for example, the average position between the center position of the first mark and the center position of the second mark. Alternatively, the controller 40 can update each of the correction values (Cx1, Cy1), (Cx2, Cy2), (Cx3, Cy3), and (Cx4, Cy4) based on the amount and direction of the change of the position of the first mark obtained by performing the alignment step. Alternatively, the controller 40 can update each of the correction values (Cx1, Cy1), (Cx2, Cy2), (Cx3, Cy3), and (Cx4, Cy4) based on the amount and direction of the change of the position of the second mark obtained by performing the alignment step. Each of the correction values (Cx1, Cy1), (Cx2, Cy2), (Cx3, Cy3), and (Cx4, Cy4) can be used to perform the alignment step while using the mark pair whose relative position is the same as the relative position of the mark pair in the shot region upon update of the correction values. As has been described above, the correction value can depend on, for example, the aberration of the detector 14 and/or the driving error of the driving mechanism 70 which drives the detector 14.

In step S106, the controller 40 determines whether the imprint process is completed for all the shot regions serving as the imprint targets of the substrate. If there is an unprocessed shot region, the process returns to step S100 to perform the imprint process on the unprocessed shot region.

Here, in addition to individual differences, the heat generated by the measurement light can be different among the plurality of detectors 14. Therefore, the correction value C in equation (2) or equation (3) is managed in the storage for each detector 14.

Figure 7A:
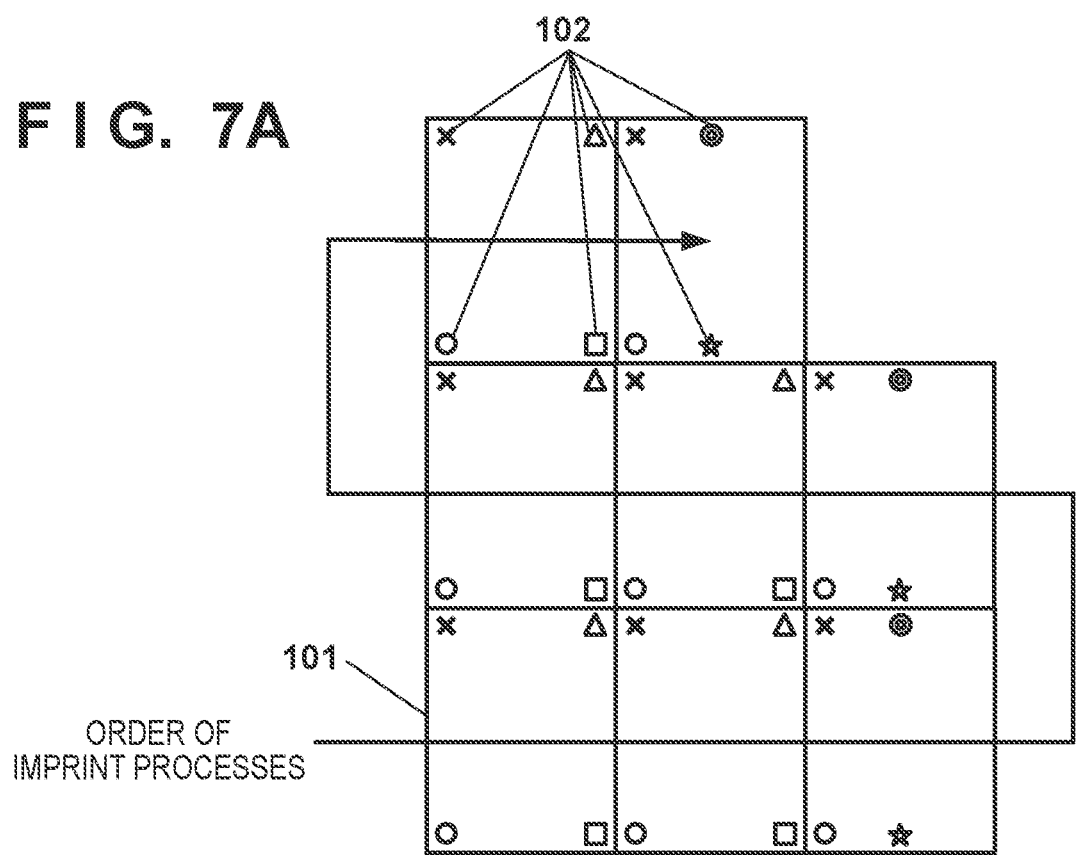
FIGS. 7A and 7B are views illustrating an operation of the imprint apparatus.
Figure 7B:
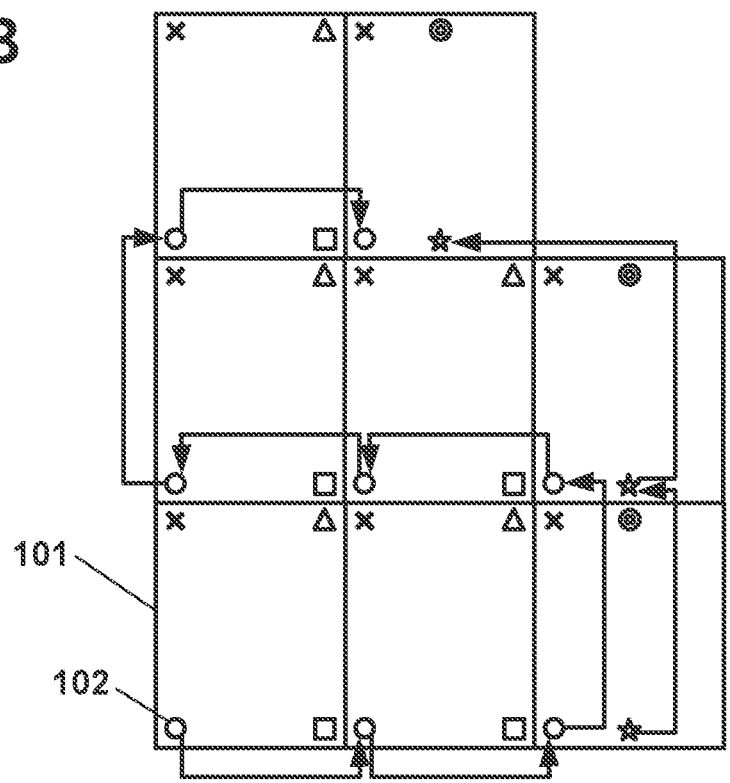

FIGS. 7A and 7B schematically show the imprint process performed on a plurality of shot regions 101 of a substrate. In FIGS. 7A and 7B, the positions of the first marks in the shot regions 101 are indicated by symbols ○, x, Δ, □, ⊙, and ☆. The shot region where Δ and □ do not exist is a shot region, which is a so-called partial shot region, whose shape is limited by the outer edge of the substrate. When the imprint process is performed in the order indicated by arrows in FIGS. 7A and 7B, there are multiple shot regions 101 in each of which alignment is performed using the mark pair whose relative position in the shot region 101 is identical among the multiple shot regions 101. For the multiple shot regions 101 as described above, the driving amount M' can be decided using, for example, the correction value C updated in the process on the immediately preceding shot region.

Further, the correction value C may be managed using the storage MEM for each of the relative positions in the shot region, which are indicated by the symbols ○, x, Δ, □, ⊙, and ☆. For □ and ⊡ and for Δ and ⊙ in FIG. 7B, the alignment operation is performed by moving the single detector 14. However, although the signal detector 14 is used, when the position largely moves such as between □ and ☆, the position of the measurement light 63 passing through the relay optical system changes. Therefore, it is preferable to manage separate correction values for the respective relative positions in the shot region. That is, when deciding the driving amount M' and driving the detector 14, the correction value for ☆ is used in alignment using ☆ and the correction value for □ is used in alignment using □. With this, even when the imprint process is performed on the partial shot region, the mark pair can be positioned in the central region of the field of view 81 of the detector 14, and the alignment detection accuracy can be improved.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 8A:
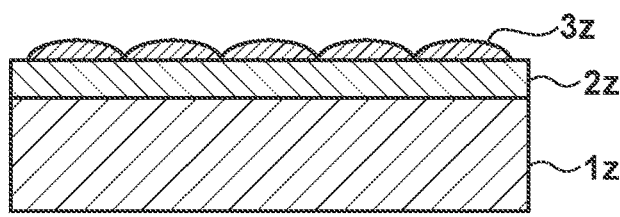
FIGS. 8A to 8F are views illustrating an article manufacturing method.

An article manufacturing method in which an imprint apparatus forms a pattern on a substrate, processes the substrate on which the pattern is formed, and manufactures an article from the processed substrate will be described next. As shown FIG. 8A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 8B:
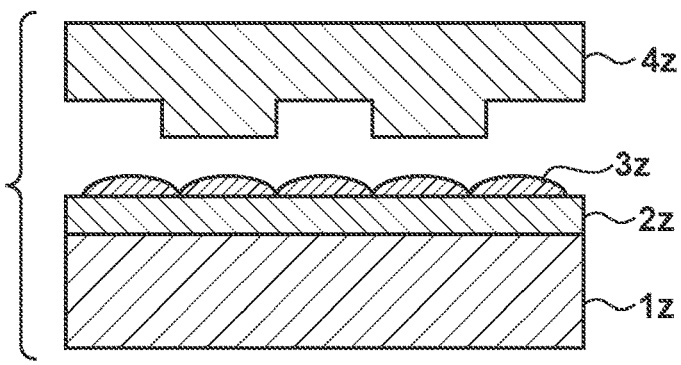
Figure 8C:
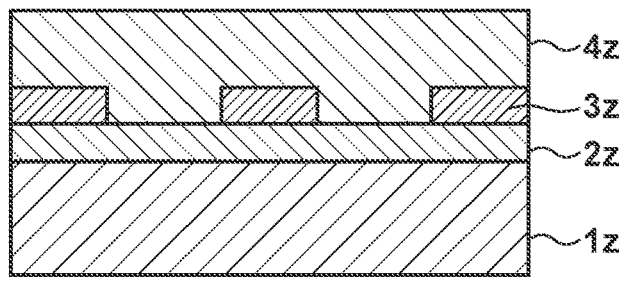

As shown in FIG. 8B, a side of a mold 4z for imprint with a concave-convex pattern is directed toward and made to face the imprint material 3z on the substrate. As shown FIG. 8C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 8D:
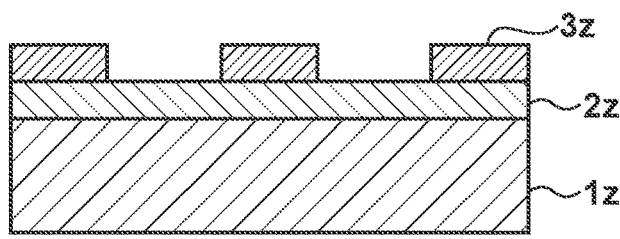

As shown in FIG. 8D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 8E:
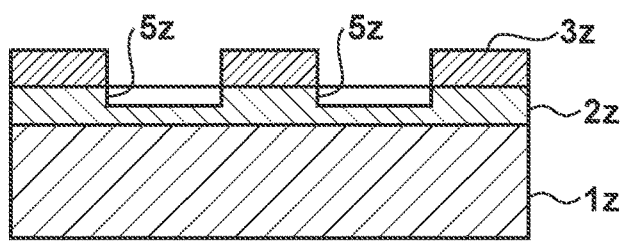
Figure 8F:
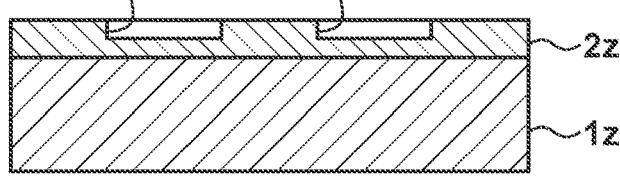

As shown in FIG. 8E, when etching is performed using the pattern of the cured product as an etching resistant mask, a portion of the surface of the processed material 2z where the cured product does not exist or remains thin is removed to form a groove 5z. As shown in FIG. 8F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-085582, filed May 20, 2021 and Japanese Patent Application No. 2022-014992, filed Feb. 2, 2022 which are hereby incorporated by reference herein in their entirety.

What is claimed is:

1. An imprint apparatus that performs, on a plurality of shot regions of a substrate, an imprint process for transferring a pattern of a mold to an imprint material arranged on the substrate, the apparatus comprising:
    a detector configured to detect a first mark provided in the substrate and a second mark provided in the mold; and
    a controller programmed to perform alignment between a shot region selected from the plurality of shot regions and the mold based on an output of the detector by:
        determining a second driving amount for driving the detector to perform the alignment between the selected shot region and the mold in accordance with a first driving amount, held in a storage, by which the detector is to be driven to fit the first mark and the second mark within a specific region of a field of view of the detector, and a correction value, obtained during alignment of a previous shot region and held in the storage, used to correct the first driving amount, wherein the correction value indicates a shift amount, at the time of the alignment, between a center position of the field of view of the detector and a representative position decided by the first mark and the second mark;
        controlling positioning of the detector based on the determined second driving amount to perform the alignment between the selected shot region and the mold; and
        updating the correction value held in the storage, and to be used during alignment of a subsequent shot region, based on the output of the detector at a time of performing the alignment for the selected shot region.

2. The apparatus according to claim 1, wherein the alignment is performed by detecting, by the detector, a moire image or an interference fringe formed by the first mark and the second mark while the mold and the substrate are in contact with each other via the imprint material.

3. The apparatus according to claim 1, wherein the correction value is held in the storage for each position of the first mark in the shot region.

4. The apparatus according to claim 1, wherein the correction value depends on an aberration of the detector.

5. The apparatus according to claim 1, wherein the correction value depends on a driving error when the detector is driven.

6. The apparatus according to claim 1, wherein the specific region is a central region of the field of view.

7. The apparatus according to claim 1, wherein if an updated correction value exists as the correction value, the controller is configured to control positioning of the detector based on the driving amount and the updated correction value.

8. The apparatus according to claim 1, further comprising a plurality of detectors including the detector,
    wherein a plurality of first marks including the first mark are provided in the substrate, a plurality of second marks including the second mark are provided in the mold, and each of the plurality of second marks corresponds to one first mark of the plurality of first marks,
    each of the plurality of detectors detects one first mark of the plurality of first marks and one second mark of the plurality of second marks, and
    the storage holds a plurality of driving amounts including the driving amount and a plurality of correction values including the correction value so as to correspond to the plurality of first marks, respectively.

9. The apparatus according to claim 8, wherein the plurality of driving amounts are different from each other, and the plurality of correction values are different from each other.

10. The apparatus according to claim 1, wherein the controller is configured to perform the alignment between the selected shot region and the mold based on a position between the first mark and the second mark obtained based on the output of the detector, and update the correction value based on a position of at least one of the first mark and the second mark in the field of view of the detector driven in accordance with the driving amount.

11. An imprint method of performing, on a plurality of shot regions of a substrate, an imprint process for transferring a pattern of a mold to an imprint material arranged on the substrate, the method comprising:
    performing alignment between a shot region selected from the plurality of shot regions and the mold, based on an output of a detector that detects a first mark provided in the substrate and a second mark provided in the mold, by:
        determining a second driving amount for driving the detector to perform the alignment between the selected shot region and the mold in accordance with a first driving amount, held in a storage, by which the detector is to be driven to fit the first mark and the second mark within a specific region of a field of view of the detector, and a correction value, obtained during alignment of a previous shot region and held in the storage, used to correct the first driving amount, wherein the correction value indicates a shift amount, at the time of the alignment, between a center position of the field of view of the detector and a representative position decided by the first mark and the second mark; and
        controlling positioning of the detector based on the determined second driving amount to perform the alignment between the selected shot region and the mold;
    performing the imprint process on the selected shot region while performing the alignment between the shot region selected from the plurality of shot regions of the substrate and the mold based; and
    updating, based on the output of the detector at a time of performing the alignment for the selected shot region, the correction value held in the storage and to be used during alignment of a subsequent shot region.

12. An article manufacturing method comprising:
    forming a pattern on a substrate by an imprint method defined in claim 11; and
    obtaining an article by processing the substrate on which the pattern has been formed.

13. An imprint apparatus that performs, on a plurality of shot regions of a substrate, an imprint process for transferring a pattern of a mold to an imprint material arranged on the substrate, the apparatus comprising:
- a detector configured to detect a first mark provided in the substrate and a second mark provided in the mold; and
- a controller programmed to perform alignment between a shot region selected from the plurality of shot regions and the mold based on an output of the detector by:
  - determining a driving amount for driving the detector to perform the alignment between the selected shot region and the mold in accordance with a target position, held in a storage, to which the detector is moved to fit the first mark and the second mark within a specific region of a field of view of the detector, and a correction value, obtained during alignment of a previous shot region and held in the storage, used to correct the target position, wherein the correction value indicates a shift amount, at the time of the alignment, between a center position of the field of view of the detector and a representative position decided by the first mark and the second mark;
  - controlling positioning of the detector based on the determined driving amount to perform the alignment between the selected shot region and the mold; and
  - updating the correction value held in the storage, and to be used during alignment of a subsequent shot region, based on the output of the detector at a time of performing the alignment for the selected shot region.

14. An imprint method of performing, on a plurality of shot regions of a substrate, an imprint process for transferring a pattern of a mold to an imprint material arranged on the substrate, the method comprising:
- performing alignment between a shot region selected from the plurality of shot regions and the mold, based on an output of a detector that detects a first mark provided in the substrate and a second mark provided in the mold, by:
  - determining a driving amount for driving the detector to perform the alignment between the selected shot region and the mold in accordance with a target position, held in a storage, to which the detector is moved fit the first mark and the second mark within a specific region of a field of view of the detector, and a correction value, obtained during alignment of a previous shot region and held in the storage, used to correct the target position, wherein the correction value indicates a shift amount, at the time of the alignment, between a center position of the field of view of the detector and a representative position decided by the first mark and the second mark; and
  - controlling positioning of the detector based on the determined driving amount to perform the alignment between the selected shot region and the mold;
- performing the imprint process on the selected shot region while performing the alignment between the shot region selected from the plurality of shot regions and the mold; and
- updating the correction value held in the storage, and to be used during alignment of a subsequent shot region, based on the output of the detector at a time of performing the alignment for the selected shot region.

15. An article manufacturing method comprising:
- forming a pattern on a substrate using an imprint method defined in claim 14; and
- obtaining an article by processing the substrate on which the pattern has been formed.

16. An imprint apparatus that performs, on a plurality of shot regions of a substrate, an imprint process for transferring a pattern of a mold to an imprint material arranged on the substrate, the apparatus comprising:
- a detector configured to detect a first mark provided in the substrate and a second mark provided in the mold; and
- a controller configured to:
  - control, based on a driving amount, held in a storage, by which the detector was driven with respect to the first and second marks to fit the first and second marks within a specific region of a field of view of the detector when alignment between the mold and a first shot region selected from the plurality of shot regions was performed based on an output of the detector, positioning of the detector for alignment between the mold and a second shot region, which is different from the first shot region and selected from the plurality of shot regions, wherein the positioning of the detector includes a shift amount, at the time of the alignment, between a center position of the field of view of the detector and a representative position decided by the first mark and the second mark; and
  - update the driving amount, held in the storage, based on the output of the detector when alignment between the mold and the second shot region was performed, the updated driving amount to be used at a time of performing alignment for a third shot region, which is different from the first shot region and the second shot region and which is selected from the plurality of shot regions.

* * * * *